United States Patent
Bjesse

(10) Patent No.: US 8,001,498 B2
(45) Date of Patent: Aug. 16, 2011

(54) METHOD AND APPARATUS FOR MEMORY ABSTRACTION AND VERIFICATION USING SAME

(75) Inventor: Per M. Bjesse, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 376 days.

(21) Appl. No.: 12/258,724

(22) Filed: Oct. 27, 2008

(65) Prior Publication Data
US 2010/0107131 A1 Apr. 29, 2010

(51) Int. Cl.
*G06F 17/50* (2006.01)
(52) U.S. Cl. ............ 716/103; 716/106; 703/14
(58) Field of Classification Search .......... 716/103, 716/106; 703/14
See application file for complete search history.

(56) References Cited

U.S. PATENT DOCUMENTS

| | | | |
|---|---|---|---|
| 6,044,211 A * | 3/2000 | Jain ............... | 716/102 |
| 6,163,876 A * | 12/2000 | Ashar et al. ............ | 716/107 |
| 6,345,379 B1 * | 2/2002 | Khouja et al. ........... | 716/115 |
| 6,415,420 B1 * | 7/2002 | Cheng et al. ............ | 716/103 |
| 6,574,787 B1 | 6/2003 | Anderson | |
| 6,625,797 B1 * | 9/2003 | Edwards et al. ......... | 716/103 |
| 6,651,228 B1 * | 11/2003 | Narain et al. ............ | 716/103 |
| 6,691,078 B1 * | 2/2004 | Beer et al. .............. | 703/14 |
| 6,823,486 B2 * | 11/2004 | Ghosh ................... | 714/738 |
| 7,020,856 B2 * | 3/2006 | Singhal et al. .......... | 716/106 |
| 7,149,987 B2 * | 12/2006 | Zhu et al. ............... | 716/103 |
| 7,284,218 B1 * | 10/2007 | Roy et al. ............... | 716/106 |
| 7,322,017 B2 * | 1/2008 | Baumgartner et al. ... | 716/104 |
| 7,373,618 B1 * | 5/2008 | Khoo et al. .............. | 716/103 |
| 7,386,818 B2 * | 6/2008 | Ganai et al. ............. | 716/107 |
| 7,742,907 B2 * | 6/2010 | Gupta et al. ............. | 703/14 |
| 7,752,588 B2 * | 7/2010 | Bose ..................... | 716/122 |
| 2002/0138812 A1 * | 9/2002 | Johannsen ............. | 716/5 |
| 2003/0105617 A1 * | 6/2003 | Cadambi et al. ........ | 703/14 |
| 2003/0208730 A1 | 11/2003 | Singhal et al. | |
| 2005/0050484 A1 | 3/2005 | Keller et al. | |
| 2006/0085774 A1 * | 4/2006 | Moorby .................. | 716/5 |
| 2008/0126066 A1 * | 5/2008 | Zhu et al. ............... | 703/15 |
| 2009/0007038 A1 * | 1/2009 | Wang et al. ............. | 716/5 |
| 2010/0077366 A1 * | 3/2010 | Bjesse ................... | 716/5 |

FOREIGN PATENT DOCUMENTS

JP 2008033404 A 2/2008

OTHER PUBLICATIONS

Search Report Mailed Mar. 31, 2010 in PCT/US2009/05530 10 pages.
Search Report Mailed Apr. 1, 2010 in PCT/US2009/05537 12 pages.

(Continued)

*Primary Examiner* — Naum Levin
(74) *Attorney, Agent, or Firm* — Haynes Beffel & Wolfeld LLP

(57) ABSTRACT

A computer implemented representation of a circuit design including memory is abstracted to a smaller netlist, which can be analyzed by standard verification tools and by other tools that operate on netlists. The correctness of such systems can require reasoning about a much smaller number of memory entries than exist in the circuit design, and by abstracting such memories to a smaller number of entries, the computational complexity of the verification problem is substantially reduced.

20 Claims, 9 Drawing Sheets

OTHER PUBLICATIONS

Jain, Himanshu, et al., "Word-Level Predicate-Abstraction and Refinement Techniques for Verifying RTL Verilog," IEEE Transactions on Computer-Aided Design of Integrated Circuits and Systems, vol. 27, No. 2, Feb. 2008, 14 pages.

Adams, Sara, et al., "Automatic Abstraction in Symbolic Trajectory Evaluation," Proc. of the Formal Methods in CAD conf. 2007, 23 pages.

Armando, Alessandro, et al., "Abstraction Refinement of Linear Programs with Arrays," Proc. International Conference on Tools and Algorithms for the Construction and Analysis of Systems LNCS 4424 pp. 373-388, 2007.

Bjesse, Per, "A Practical Approach to Word Level Model Checking of Industrial Netlists," 20th Int'l Conf. on Computer Aided Design, Jul. 2008, 13 pages.

Bryant, Randal E., et al., "Modeling and Verifying Systems using a Logic of Counter Arithmetic with Lambda Expressions and Uninterpreted Functions," Lecture Notes in Computer Science; vol. 2404 archive, Proceedings of the 14th International Conference on Computer Aided Verification pp. 78-92 Year of Publication: 2002.

Burch, Jerry R., et al., "Automatic verification of Pipelined Microprocessor Control," In Proceedings of the 6th international Conference on Computer Aided Verification (Jun. 21-23, 1994). D. L. Dill, Ed. Lecture Notes in Computer Science, vol. 818. Springer-Verlag, London, 68-80.

Clarke, E. M., et al, "Word level model checking-avoiding the Pentium FDIV error.," In Proceedings of the 33rd Annual Conference on Design Automation (Las Vegas, Nevada, United States, Jun. 3-7, 1996). DAC '96. ACM, New York, NY, 645-648.

Clarke, Edmund, "Counterexample-Guided Abstraction Refinement," Proc. of the computer aided verification conf. 2000, 2 pages.

Galler, Bernard A., et al., "An Improved Equivalence Algorithm," Communications of the ACM archive, vol. 7, Issue 5 (May 1964) pp. 301-303.

Ganai, Malay K., et al., "Efficient Modeling of Embedded Memories in Bounded Model Checking," in Proceedings of Computer Aided Verification (CAV), 2004 13 pages.

Ganai, Malay K., et al., "Verification of embedded memory systems using efficient memory modeling," Design, Automation and Test in Europe, 2005. Proceedings 2005 pp. 1096-1101 vol. 2.

Glokler, Tilman, et al., "Enabling Large-Scale Pervasive Logic Verification through Multi-Algorithmic Formal Reasoning," Formal Methods in Computer Aided Design, 2006. FMCAD '06, Nov. 2006 pp. 3-10.

Hojati, R. and Brayton, R. K. 1995. Automatic Datapath Abstraction in Hardware Systems. In Proceedings of the 7th international Conference on Computer Aided Verification (Jul. 3-5, 1995). P. Wolper, Ed. Lecture Notes in Computer Science, vol. 939. Springer-Verlag, London, 98-113.

Ip, C. Norris, et al., "Better Verfication Through Symmetry," Formal Methods in System Design 9, 41-75, 1996.

Johannsen, Peer, Dissertation, "Speeding Up Hardware Verification by Automated Data Path Scaling," Aug. 2002, 201 pages.

Manolios, Panagiotis, et al., "BAT: The Bit-Level Analysis Tool," Proceedings of Computer Aided Verification (CAV) 2007, LNCS 4590, pp. 303-306, 2007.

McMillan, K.L., "Verfication of an implementation of Tomasulo's algorithm by compositional model checking," In A. Hu and M. Vardi (editors) Proc. 10th International Conference on Computer Aided Verification (CAV'98), vol. 1427 of LNCS, pp. 110-121, Springer. 1998.

Peh, Li-Shiuan, et al., "A Delay Model and Speculative Architecture for Pipelined Routers," Proc. 7th Int'l Symp on High-Performance Computer Architecture, Jan. 22-24, 2001, Monterrey, Mexico, pp. 255-266.

Pugh, William, "Skip Lists: A Probabilistic Alternative to Balanced Trees," Communications of the ACM, vol. 33, No. 6, Jun. 1990, 9 pages.

Ranise, Silvio et al, "Satisfiability Modulo Theories," p. 77-79, IEEE Nov./Dec. 2006, Trends & Controversies, Intelligent Systems and Formal Methods in Software Engineering.

Seger, Carl-Johan H., et al., "Formal Verification by Symbolic Evaluation of Partially-Ordered Trajectories," Technical Report. UMI Order Number: TR-93-08., University of British Columbia, Jul. 1, 1999, 41 pages.

Sheeran, Mary, et al., "Checking Safety Properties Using Induction and a SAT-Solver, " In Proceedings of the Third international Conference on Formal Methods in Computer-Aided Design (Nov. 1-3, 2000). W. A. Hunt and S. D. Johnson, Eds. Lecture Notes in Computer Science, vol. 1954. Springer-Verlag, London, 108-125.

\* cited by examiner

METHOD AND APPARATUS FOR MEMORY ABSTRACTION AND VERIFICATION USING SAME

BACKGROUND

1. Field of the Invention

The present invention relates to integrated circuit design, and more particularly to electronic design automation tools and tools for verification and analysis of complex designs including memory.

2. Description of Related Art

Analysis of word-level designs, which leverages design information captured at a higher level than that of individual wires and primitive gates, is a new frontier in hardware verification. At the word level, data path elements and data packets are viewed as entities in their own right as opposed to a group of bit-level signals without any special semantics.

Today's model checking technology works well for checking control oriented properties. However, it does not work well with designs where there are wide datapaths, and large memories. Previous approaches tried to speed up the process by reading designer annotations, or computing increasingly precise abstractions of the design. However, annotations are very time consuming for the designer, and the computation of abstractions can be as hard as solving the original problem.

There has been a lot of activity lately around word-level formula decision procedures such as SMT solvers (S. Ranise and C. Tinelli. *Satisfiability modulo theories. Trends and Controversies*—IEEE Intelligent Systems Magazine, December 2006) and reduction-based procedures like UCLID (R. Bryant, S. Lahiri, and S. Seshia. *Modeling and verifying systems using a logic of counter arithmetic with lambda expressions and uninterpreted functions*. In Proc. of the Computer Aided Verification Conf., 2002) and BAT (P. Manolios, S. Srinivasan, and D. Vroon. BAT: *The bit-level analysis tool*. In Proc. of the Computer Aided Verification Conf., 2007). However, as promising as this direction of research is, the use of these procedures for model checking is inherently restricted in that they analyze formulas rather than sequential systems. This has two consequences: First of all, sequential properties can only be checked using these procedures by relying on methods such as induction and interpolation that employ bounded checks to infer unbounded correctness. Second, these procedures do not fit into a transformation-based approach to sequential system verification (J. Baumgartner, T. Gloekler, D. Shanmugam, R. Seigler, G. V. Huben, H. Mony, P. Roessler, and B. Ramanandray. *Enabling large-scale pervasive logic verification through multi-algorithmic formal reasoning*. In Proc. of the Formal Methods in CAD Conf., 2006), where sequential verification problems are iteratively simplified and processed by any of a large set of back-end model checkers.

One of the largest stumbling blocks for traditional model checking is the presence of large memories intermingled with complex control logic. This will typically result in very hard or intractable model checking problems. Therefore, it would be desirable to efficiently implement for practical word-level model checking of both bounded and unbounded properties for hardware designs including large memories.

SUMMARY

A netlist reduction method is provided where a netlist for a circuit design including memory is abstracted to a smaller netlist, which can be analyzed by standard verification tools and by other tools that operate on netlists. The correctness of such systems can require reasoning about a much smaller number of memory entries than exist in the original circuit design. By abstracting such memories to a smaller number of entries, the computational complexity of the verification problem is substantially reduced.

A computer implemented representation of a circuit design can be reduced in a method that includes representing the circuit design as a data structure defining a netlist including a plurality of nodes, such as in the form of a directed acyclic graph DAG. For example, a circuit design represented by a high-level description language can be processed to produce this type of input data structure. The input data structure is processed to produce an updated netlist with less complexity, requiring fewer memory slots for implementation, while attempting to maintain pre-specified properties of the circuit design represented by the netlist.

The processing of the input netlist includes identifying memories in the circuit design, and identifying an address of a slot, or addresses of slots, in an identified memory for which the corresponding slot or corresponding slots are needed to meet a specified property of interest. The nodes in the netlist representing such memories are replaced with substitute nodes implementing the slot or slots. A verification condition is implemented that enables checking of the specified property using the substitute nodes. Applying the processes described herein, the size of the memory represented in the updated netlist is reduced by eliminating nodes representing slots that are not needed to meet the specified property.

The slot or slots of identified memories in the netlist are replaced with substitute nodes, including for each represented slot a current state substitute node (named "cont" in examples below) containing the data for the represented slot, a next state substitute node, and a node (named "sel" in examples below) and corresponding next state node, identifying the represented slot by its address. Nodes representing writes to a represented slot are implemented using a multiplexer that updates the contents of the next state substitute node for the slot with write data if the write address matches the contents of the node identifying the slot, or else updates the contents of the next state substitute node for the represented slot with contents of the current state substitute node. For nodes in the netlist representing reads to a represented slot, the substitute nodes include a multiplexer returning the contents of the current state substitute node for the represented slot if the read address matches the contents of the node identifying the slot, or else returns non-determinate data read from the environment.

The process of identifying memories in the input netlist, includes identifying remodellable memories (including parts of memory arrays or complete memory arrays), which are characterized in that all read and write nodes addressing the current state and the next state nodes of the memory read and write data of the same width and use address nodes of the same width, and that the slot or slots in the memory are initialized to a determinate value in a common manner.

Slots to be represented in the updated netlist are selected by identifying abstraction pairs, where the abstraction pairs contains respective nodes describing a corresponding slot in the memory which must be represented and describing during which cycles they must be represented, in the updated netlist in order to satisfy a property such as a safety definition for the circuit design. Thus, the abstraction pairs correspond with a represented slot represented in the updated netlist, and include a node identifying the represented slot and a delay parameter indicating a cycle in which the represented slot is read to satisfy the property.

A verification function in the form of a combinational output is re-written so that the output is checked when the nodes specified in the abstraction pairs have had values corresponding to the corresponding slots in the appropriate previous cycle times. The abstraction pairs relevant to a particular property of interest are used in the implementation of the updated netlist, to establish a set of nodes in the updated netlist that for each abstraction pair specifying a represented slot in an indicated cycle, compares the abstracted node with the node identifying the represented slot in the cycle indicated by the delay parameter of the abstraction pair. If matches are indicated for the relevant abstraction pairs, then the output of the property of interest is checked.

The abstraction pairs are identified using a counter-example guided refinement process in one implementation described herein. For example, abstraction pairs can be identified by iteratively performing a model checking process over the updated netlist, starting with an initial updated netlist such as an implementation with no abstraction pairs. If the model checking fails in a particular state, the trace causing the failure is captured, and then using the original input netlist a simulation is run based on the set of inputs and initial state variable assignments determined from the trace from the particular state. If the simulation of the original netlist does not indicate the failure, then the updated netlist is processed to find erroneous reads responsible for the failure. Abstraction pairs are selected to address the erroneous reads, and the selected abstraction pairs are added to the updated netlist. The iteration returns to the model checking step, and repeats the process, until the updated netlist passes the model checking, until a real bug is detected in the simulation step, or until the updated netlist becomes larger than a target size.

In implementations using the directed acyclic graph data structure mentioned above, top-level nodes in the graph include word-level nodes representing circuit outputs and next-state variables, bottom-level nodes in the graph include said word-level nodes representing inputs, state variables and binary constant vectors, and internal nodes in the graph include memories and word-level nodes representing operators.

The technology introduced in the present application processes a word-level netlist to identify remodellable memories which interact with their environment using dedicated read and write nodes only, are initialized in a uniform way, and are accessed uniformly. The remodellable memories can be abstracted in a manner that allows proofs for properties when the proof can be done by reasoning about a significantly smaller number of memory slots and time instances than would be needed in a standard bit-level model check.

The technology described herein can be implemented as a process executed on a data processing machine, as a data processing machine adapted to execute the procedures described, and as a computer program executable by a data processing machine, and stored on a computer readable data storage medium. In addition, the technology herein is part of a process for manufacturing an integrated circuit including the development of data defining a pattern, such as layout data for a mask or a set of masks used in lithographic processes in integrated circuit manufacturing.

Features of processes described herein include that implementations can operate on standard safety property verification problems, can be completely automatic without any need for abstraction hints, can be useable with typical bit-level model checkers as a back-end decision procedure, and can fit seamlessly into a standard transformational verification paradigm.

Other aspects and advantages of the present invention can be seen in the drawings, detailed description and claims which follow.

DETAILED DESCRIPTION

Figure 1:
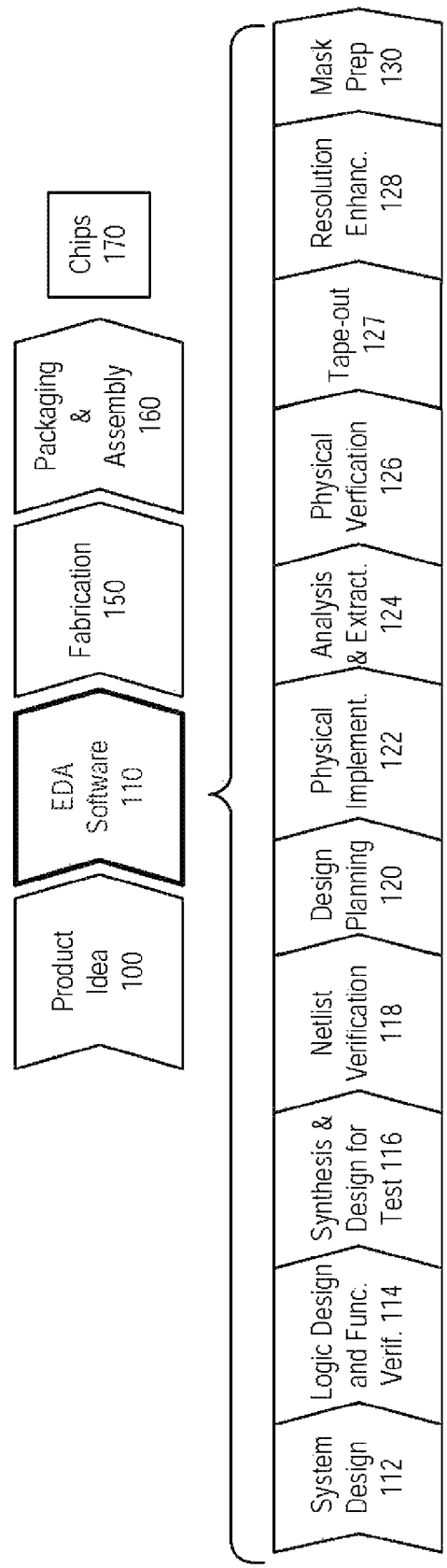
FIG. 1 shows a simplified representation of an illustrative integrated circuit design flow.

FIG. 1 is a simplified representation of an illustrative integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied. Such rearrangement possibilities will be apparent to the reader.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (block 110) will now be provided.

System design (block 112): The designers describe the functionality that they want to implement, they can perform what-if planning to refine functionality, check costs, etc. Hardware-software architecture can occur at this stage.

Example EDA software products from Synopsys, Inc. that can be used at this step include Model Architect, Saber, System Studio, and DesignWare® products.

Logic design and functional verification (block 114): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products. The word-level netlist reduction technology using memory abstraction as described in more detail below can be implemented as a part of, or as an add-on tool, for the Magellan product for example.

Synthesis and design for test (block 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Complier, FPGA Compiler, TetraMAX, and DesignWare® products.

Netlist verification (block 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (block 120): Here, an overall floor plan for the chip is constructed and analyzed for timing and top-level routing. Example EDA software products from Synopsys, Inc. that can be used at this step include Astro and IC Compiler products.

Physical implementation (block 122): The placement (positioning of circuit elements) and routing (connection of the same) occurs at this step. Example EDA software products from Synopsys, Inc. that can be used at this step include AstroRail, Primetime, and Star RC/XT products.

Analysis and extraction (block 124): At this step, the circuit function is verified at a transistor level, this in turn permits what-if refinement. Example EDA software products from Synopsys, Inc. that can be used at this stage include AstroRail, PrimeRail, Primetime, and Star RC/XT products.

Physical verification (block 126): At this stage various checking functions are performed to ensure correctness for: manufacturing, electrical issues, lithographic issues, and circuitry. Example EDA software products from Synopsys, Inc. that can be used at this stage include the Hercules product.

Tape-out (block 127): This stage provides the "tape-out" data for production of masks for lithographic use to produce finished chips. Example EDA software products from Synopsys, Inc. that can be used at this stage include the CATS(R) family of products.

Resolution enhancement (block 128): This stage involves geometric manipulations of the layout to improve manufacturability of the design. Example EDA software products from Synopsys, Inc. that can be used at this stage include Proteus/Progen, ProteusAF, and PSMGen products.

Mask preparation (block 130): This stage includes both mask data preparation and the writing of the masks themselves. Example EDA software products from Synopsys, Inc. that can be used at this stage include CATS(R) family of products.

Embodiments of the netlist reduction technology described herein can be used during one or more of the above-described stages. For example, embodiments of the present invention can be used during logic design and functional verification (block 114 of FIG. 1). At this stage, the VHDL or Verilog code for modules in the system is written and the design is checked for functional accuracy. More specifically, the design is checked to ensure that it produces the correct outputs in response to particular input stimuli.

Figure 2:
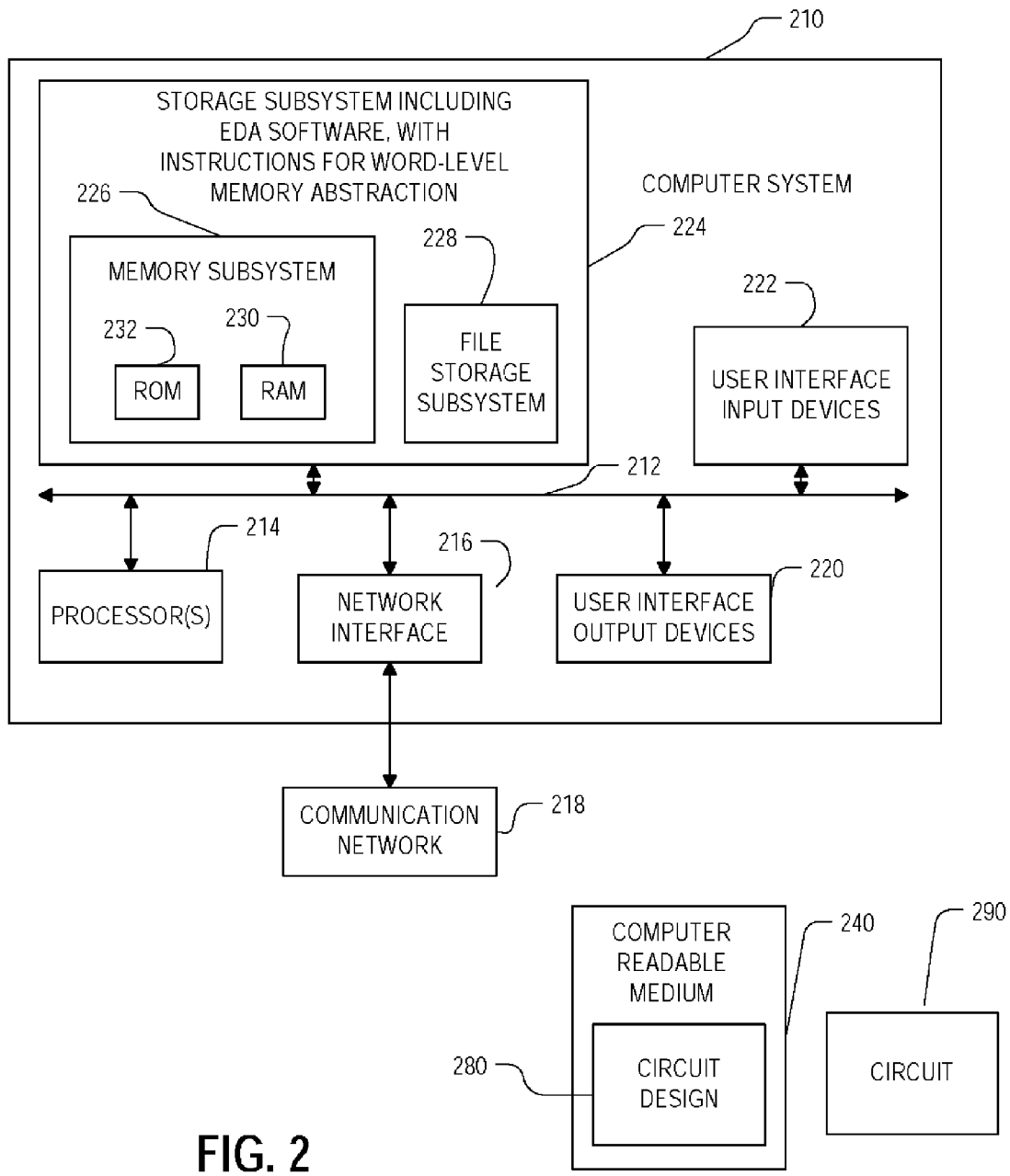
FIG. 2 is a simplified block diagram of a computer system suitable for use with embodiments of the technology, as well as a circuit design and circuit embodiments of the technology.

FIG. 2 is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto communication network 218.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of some or all of the EDA tools described herein, including the netlist reduction technology and verification tools applied for analysis of the reduced netlist. These software modules are generally executed by processor 214.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer readable medium 240 can be a medium associated with file storage subsystem 228, and/or with network interface subsystem 216. The computer readable medium can be a hard disk, a floppy disk, a CD-ROM, an optical medium, removable media cartridge, or electromagnetic wave. The computer readable medium 240 is shown storing a circuit design 280, including for example an HDL description of a circuit design, and a reduced netlist created with the described technology. Also shown is a circuit 290 created with the described technology.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 2 is intended only as a specific example for purposes of illustrating the preferred embodiments. Many other configurations of computer system 210 are possible having more or less components than the computer system depicted in FIG. 2.

Figure 3:
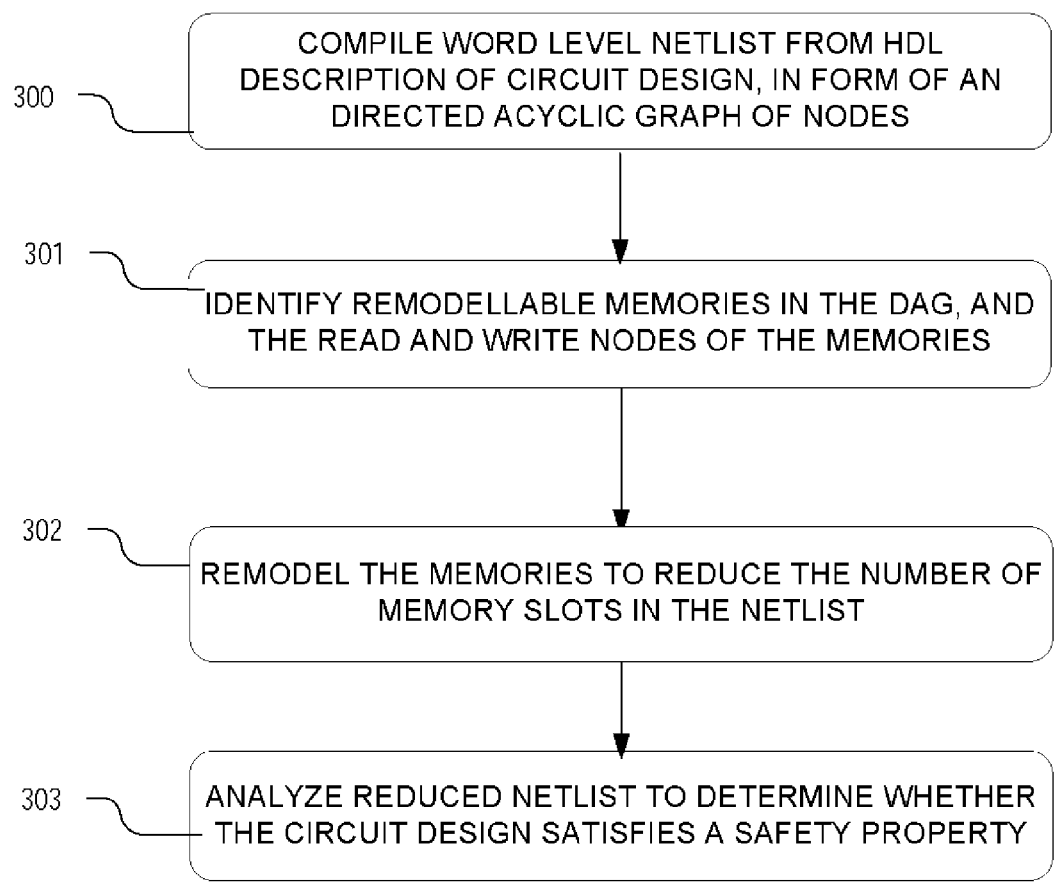
FIG. 3 is a simplified flow chart for a process for reducing the size of a data structure representing a circuit design including memory, and performing a verification process using the reduced data structure.

FIG. 3 is a basic flowchart for a process for performing a verification step for a circuit design that includes operating on a reduced netlist. In the process of FIG. 3, a word-level netlist including a plurality of nodes is compiled from a high-level description language description of a circuit design, preferably in the form of a directed acyclic graph of nodes (block 300). Embodiments of the memory abstraction technology operate on word-level nodes. However, alternative systems can be applied to bit-level implementations. A standard front end flow takes a Register Transfer Level (RTL) description expressed for example in Hardware Description Language (HDL), supplemented with the definitions of user constraints, properties and other information, and produces the implicitly clocked DAG representation described in detail below. A standard front end flow is used which compiles a circuit design into netlists by processing a hardware design with properties and constraints into a plurality of nodes representing combinational logic over a set of unconstrained inputs I, state variables S and constants. The top of the resulting plurality of nodes contain next-state variables S' and single bit outputs O. The properties which can be verified using this technology include all safety properties whose failure is signaled by some output assuming the value "false". A safety property is a subclass of properties of circuit design, which has the form that some output always holds (i.e., whose failure can always be shown by a finite trace). In addition, each state variable can be assumed to have unknown initial state in some embodiments.

The internal nodes in a graph compiled in this manner include the following:

node1=not(node2)
node1=and(node2, node3)
node1=arithOp(node2, node3), for arithOp being a member of $\{+, -, \ldots\}$
node1=compOp(node2, node3), for compOp being a member of {less than, less than or equal to, equal to, not equal to, greater than or equal to, greater than}
node1=mux(selector, node2, node3)
node1=extract(x, node2)
node1=concat(node2, node3, ...)
node1=read(op1, addrj)
node1=write(opk, addri, dataj)

The "not" and "and" operators are bitwise operators in the sense that bit i of the result is generated by applying the Boolean operator to bit i of the input nodes. The "mux" node returns node2 if selector is true and node 3 otherwise. The "extract" node constructs a smaller bit vector by projecting out k bits from position (x) to (x+k−1) of its operand. Finally, the "concat" node forms a larger signal by concatenating its operands to form a larger bit vector. Earlier operands in the argument list to concat become higher order bits, so concat (01, 00) becomes 0100.

The select signal of mux and the output of comparison operator nodes are restricted to have a bit width of one. Such signals are said to be bit-level signals. Signals that are not bit-level signals, are referred to as word-level signals. The term "segment" denotes a group of contiguous bits, and can refer to an entire word, or parts of a word.

The read and write nodes are used for modeling memories. The semantics for a read node specify that for a read node of width w, the node returns the result of projecting out the bits at location addr*w ... (addr+1)*(w−1) from the bit vector op in its argument. For a write node having a data operand of width w, the write node returns the bit vector which would result from overwriting the region addr*w ... (addr+1)*(w−1) of the bit vector op in its argument with the data in its argument. The address space of the read and write nodes need not be restricted in any particular fashion. Out of bounds reads return nondeterministic values for nonexistent bits. Out of bounds writes do nothing. Dedicated "memory" register nodes, or restrictions on what signals read and write nodes can be applied to, are not necessary. Thus, RTL memory designs can be modeled as bit vector registers just like any other nodes. By appropriate use of control logic, together with multiple read and write nodes, the DAG in this example supports arbitrarily complex memory interfaces with large numbers of read and write ports. Moreover, by nesting reads, writes and other nodes, complex policies can be implemented on update and read orders resulting from same-cycle reads and writes.

Returning to FIG. 3, the input netlist is traversed to identify the remodellable memories and the read and write nodes of the memories (block 301). A remodellable memory is a memory that can be extracted using this technique. Basically, a remodellable memory in one practical implementation can be limited to those in which all of the slots are addressed in a uniform way, which only communicate with the rest of the design in such a way that another implementation easily can be substituted, and have a next state function of the particular simple structure. More formally, in one implementation given a register variable mem, the set of memory nodes, labeled "pure memory nodes" for mem, can be recursively defined as follows:

1) the node mem is a pure memory node for mem;
2) write($op^k$, $addr^j$, $data^j$) is a pure memory node for mem of $op^k$ is a pure memory node for mem;
3) mux($sel^l$, $optrue^k$, $opfalse^k$) is a pure memory node for mem if $optrue^k$ and $opfalse^k$ are pure memory nodes for mem.

The set of pure read nodes for a state variable mem is comprised of all netlist read nodes read($op^i$, $addr^j$) for which $op^i$ is a pure memory node for mem. Also, the set of write nodes for mem is comprised by all netlist nodes write($op^k$, $addr^j$, $data^j$) for which $op^k$ is a pure memory node for mem.

Given this terminology, a remodellable memory can be defined as a register state variable mem that fulfills the following requirements:

1) all read and write nodes that have mem in their support read and write data of the same width w using address nodes of the same width a. Moreover, the bit width of mem is an integer multiple m of w, and $2a \leq m*w$ so that all memory accesses occur inside the memory.

2) mem is either initialized to a Boolean constant 0000 ... 0, 1111 ... 1, or another determinant initialization value.
3) the next state function for mem is a pure memory node for mem and no other next state function is a pure memory node for mem.
4) every fanout path from mem is made out of a sequence of pure memory nodes terminating either in (1) the next state node for mem, or (2) a pure read node.

The first requirement ensures that the memory is treated as a bit vector of slots that are read and written in a uniform way. The second requirement ensures that all of the slots have the same initial state, which guarantees that the slots selected for representation in the updated netlist all have the same initial state. The remaining requirements ensure that the memory register only occur in the fanin of other state registers and outputs through read nodes, and that the next-state function for the memory is a simple multiplexer tree that chooses between different write nodes updating the memory.

The definition of remodellable memories utilized in this description provides a balance between being able to cover most interesting memory implementations, while being simple enough to provide relatively straightforward memory abstraction algorithms. Other types of memory can also be remodeled with suitable processing to account for exception conditions.

Given a netlist encoded as a word-level DAG, a straightforward linear traversal algorithm can be used to extract the set of remodellable memories, and compute their associated sets of read and write nodes.

Returning again to FIG. 3, once the remodellable memories have been identified along with their sets of read and write nodes, the memory is remodeled to reduce the number of memory slots represented, to those slots that are needed to satisfy a specified property of interest, such as a safety property or set of safety properties, as described in more detail below (block 302).

The reduced netlist is then processed to determine whether the circuit design satisfies the specified property, or a more rigorous model checking can be executed (block 303). As mentioned below, the model checking on a particular reduced netlist can be implemented as part of the abstraction refinement loop in representative embodiments. Also, the reduced netlist can be processed in a wide variety of tools, including tools operating within a transformation-based approach to sequential system verification.

Figure 4:
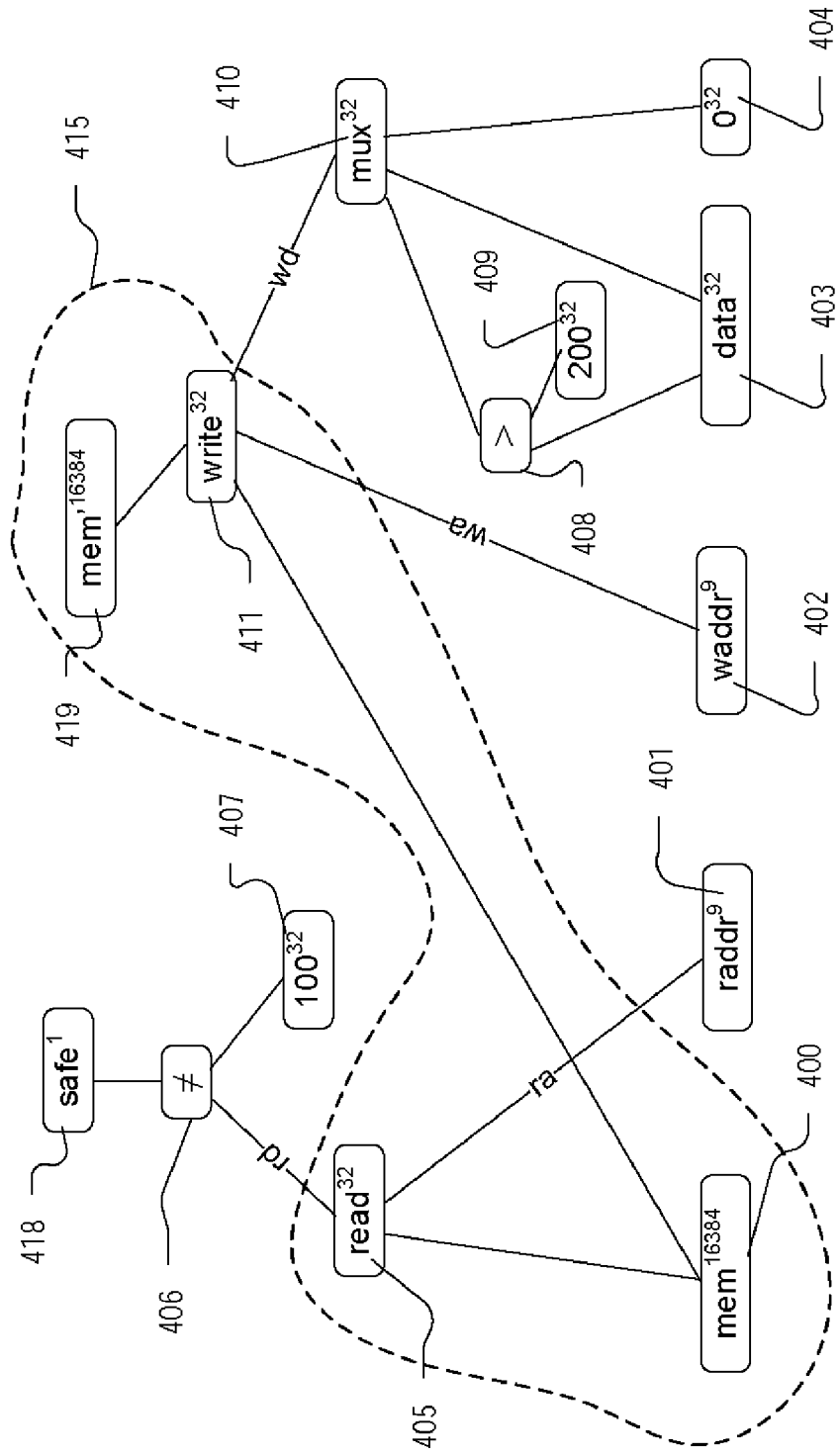
FIG. 4 is a representative example of a netlist implemented as a directed acyclic graph including a memory and plurality of nodes.

FIG. 4 illustrates an example netlist implemented in a DAG form including a circuit design containing memory. At the bottom of the DAG, the netlist includes mem$^{16384}$ which is the current state node 400 for the memory having a width of 16384 bits, a read address node raddr$^9$ 401 of width 9, a write address node waddr$^9$ 402 width 9, a data node data$^{32}$ 403 of width 32, and a constant node 0$^{32}$ 404 of width 32. The top of the DAG includes the output node safe$^1$ 418 of width 1, and the next state node mem'$^{16384}$ 419 for the memory. A read node 405 produces an output by reading the memory node 400 using the address at node 401. A comparator node 406 compares the output of read node 405 with the constant 100$^{32}$ stored in node 407.

The > operator node 408 compares the contents of the data node 403 with the contents of the constant 200$^{32}$ in node 409. The result of the operator in node 408 is applied as the selector input to a multiplexer 410. The multiplexer 410 selects the contents of the data node 403 when the output of the node 408 is true, or the constant 0$^{32}$ from node 404 when the output of node 408 is false. A write node 411 writes the next state register 406 for the memory node 400, at the address supplied in the write address node 402 using the data provided at the output of the multiplexer node 410.

Thus, at each clock cycle, the system reads the content of a slot at address raddr from mem. It also writes the input data to the slot at address waddr if the data is greater than 200, else it writes zero. The property that is implemented is a safety property, requiring that the value read from mem is never equal to 100. Clearly this is true for any execution trace in this simple system. Also, this statement can be proven by reasoning about the contents over time of a single slot in the memory, that is the last slot read.

The circuit modeled in FIG. 4 can be conceptually partitioned into two parts. The first part (enclosed by dashed line 415) contains the large memory mem, and communicates with the rest of the design through two inputs and two outputs: a nine bit wide write address port wa between nodes 402 and 411, a 32-bit wide write data port wd between nodes 410 and 411, a nine bit wide read address port ra between nodes 401 and 405, and a 32-bit wide read data port rd between nodes 405 and 406. The second part of the circuit of FIG. 4 is the balance of the circuit.

Figure 5:
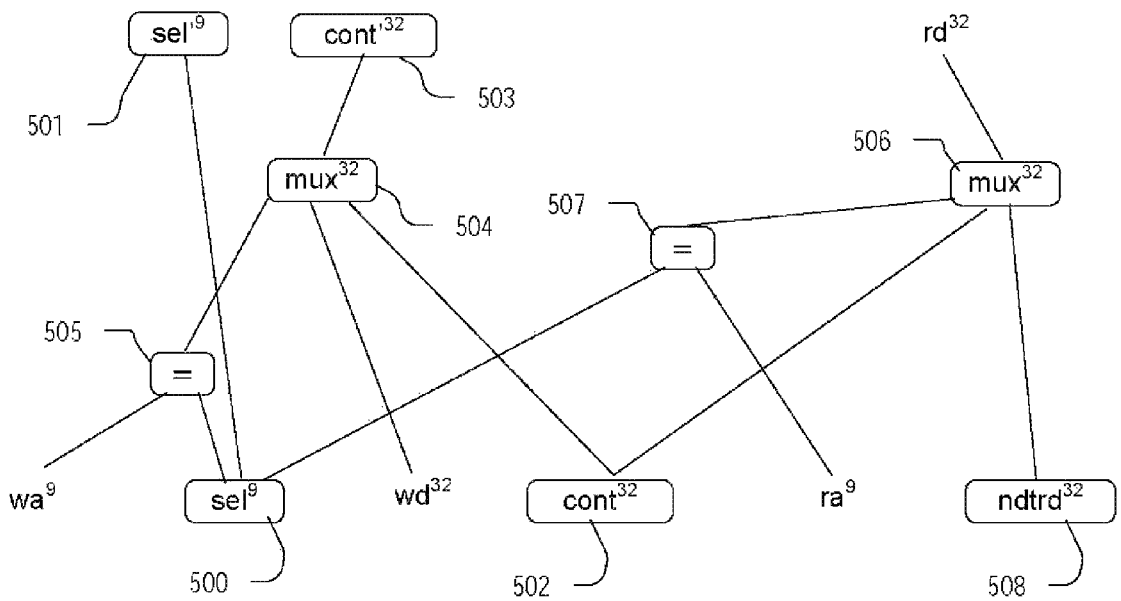
FIG. 5 illustrates an abstraction of the circuit design shown in FIG. 4.

The memory shown in FIG. 4 can be abstracted as shown in FIG. 5, by substituting the 16384 bit wide, current state and next state memory nodes, with current state and next state versions of two registers: a sel node 500 and sel' node 501, nine bits wide, which identifies a represented slot in the memory such as by containing the address for the slot, and a cont node 502 and cont' node 503, each 32-bits wide, which act as the container for the contents of the represented slot. The slot to be represented in this way is chosen during initialization of the circuit, and stays the same during subsequent system execution. The node sel in this implementation has an unconstrained initial state, and a next state function that just propagates the current state value to the next state node 501. The register cont 502, 503 is initialized to the specified initialization value for the memory slots, such as all zeros.

Write node from the implementation in FIG. 4 is replaced by multiplexer 504, which updates the next state value for cont with the data on the write data port wd$^{32}$, if the contents of the sel node 500 equal the address on the write address port wa$^9$ as indicated by the output of comparator 505; else, it propagates the current state node 502 of cont to the next state node 503. The read node from the implementation FIG. 4 is replaced by multiplexer 506, which supplies the read port rd$^{32}$ with the contents from the current state node 502 for cont, if the contents of the sel node 500 equal the address on the read address port ra$^9$ as indicated by the output of comparator 507; else it supplies non-determinate data from a non-determinate read node 508.

Figure 6:
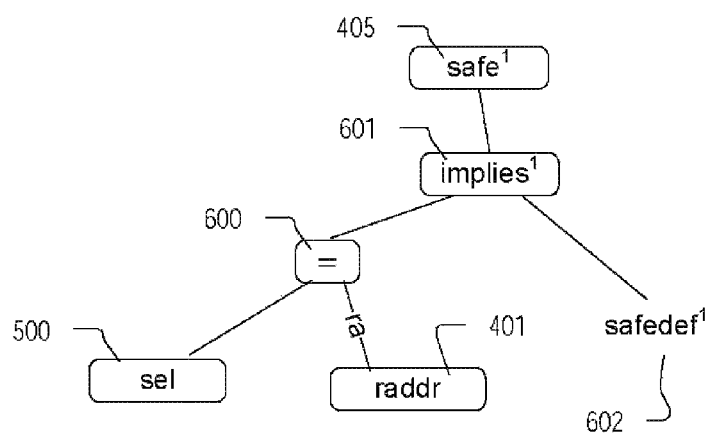
FIG. 6 illustrates an implementation of a safety property for use with the abstraction of FIG. 5.

In addition, the netlist is updated to change the definition of correctness so that the property of interest is checked only when the address that is read from the current clock cycle is the address of the represented slot indicated by the sel node 500, in this example as shown in FIG. 6. Thus, the output safe in node 408 is fed by the output of the implication operator 601. The implication operator 601 only checks the output of the original safe definition circuitry safedef$^1$ 602, if the node 401 feeding a read address port ra matches the contents of the sel node 500, as indicated by the output of node 600. This implementation prevents a spurious counter-example introduced by the abstraction of the memory which occurs (1) where the value of raddr in the final cycle is different from the value chosen as the initial value for sel and (2) the contents of ndtrd 508 are 100. In this counter-example, the slot chosen for representation by the initialization of sel is not in sync with the address that is read in the counter-example. This results in an erroneous read that could mistakenly trigger a false output for the safe definition. By re-implementing the verification condition as shown in FIG. 6, the possibility of an erroneous false indication is eliminated.

In the example just described with reference to FIGS. 4-6, the memory was abstracted over the current value of the slot identified by the raddr node 401. This worked well for that example. However for many systems, memory accesses from a number of previous time instances or cycles have to be performed correctly to guarantee that correctness of the system can be checked in the current cycle. For example, in order to check that a complete multi-part message is always forwarded correctly, then a safety definition may require performance of a sequence of reads correctly over time. In order to handle these types of systems, the remodellable memory is abstracted in this procedure over a set of abstraction pairs ($v_i$, $d_i$), where $v_i$ is a signal, such as the raddr node 401, containing a read address of a slot to be represented, and $d_i$ is an integer time delay indicating a number of cycles preceding the current cycle. The node $v_i$ and all abstraction pairs must have the same width as the address nodes of the reads and writes operating on the memory. In the example described with reference to FIGS. 4-6, the memory was abstracted over a single abstraction pair {(raddr9, 0)}.

Figure 7:
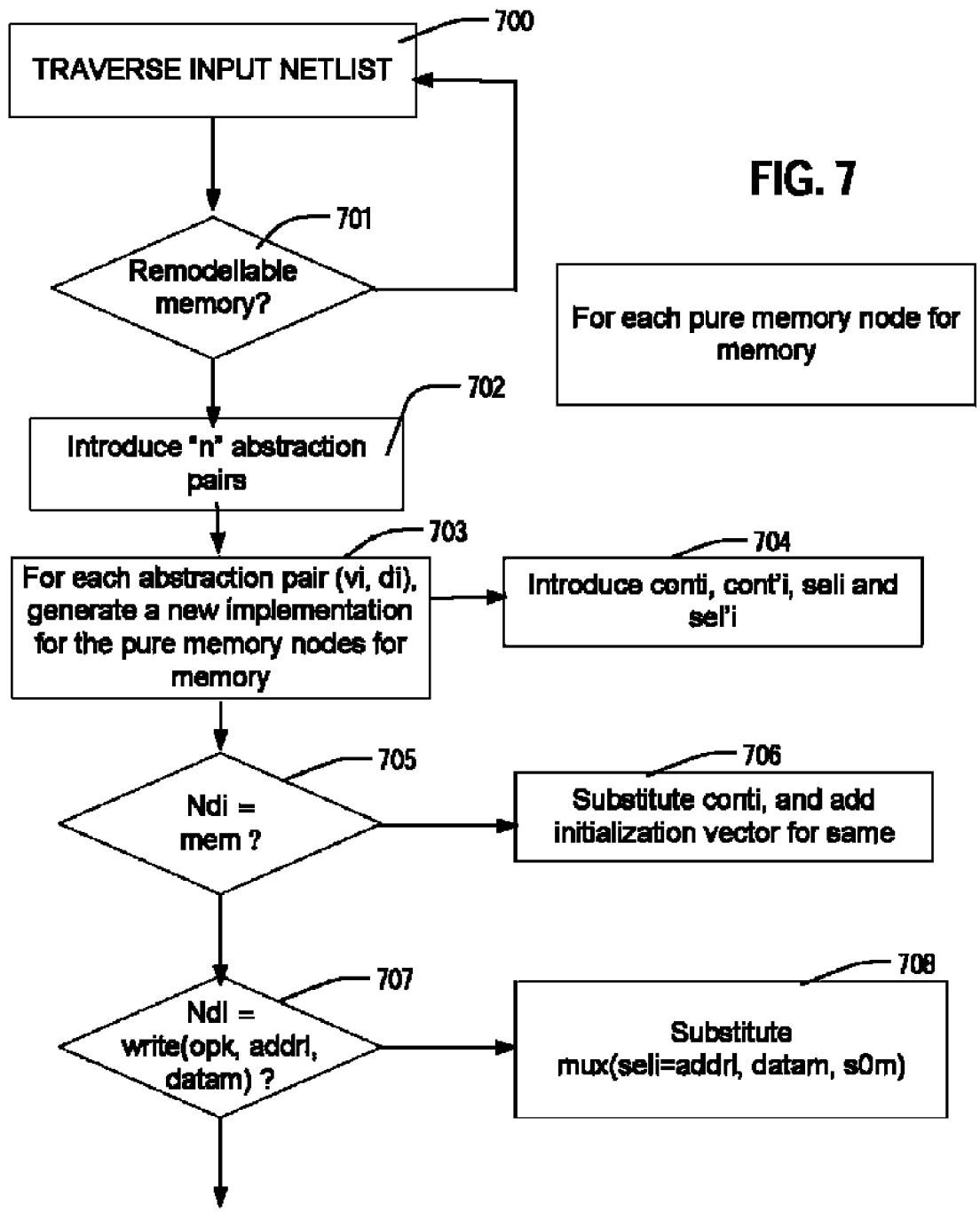
FIGS. 7-8 show a more detailed flow chart of a process for reducing the size of a data structure representing a circuit design by abstracting memories.

The set of abstraction pairs to be utilized in a particular implementation of a reduced netlist is identified by the processes described below. Assuming that abstraction pairs have been identified, FIGS. 7 and 8 provide a flow chart for introducing represented slots, re-implementing read nodes, and modifying the verification condition to produce an updated netlist.

The process involves traversing an input netlist to identify a remodellable memory (block 700, block 701). For each remodellable memory, a number "n" of abstraction pairs is introduced (block 702). Each abstraction pair ($v_i$, $d_i$) is processed as indicated at block 703, by introducing the current state variable $sel_i$ for ($v_i$, $d_i$) with an uninitialized initial state function, and a next state function that just propagates the previous state value as described above to the next state variable $sel'_i$ (Block 704). The $sel_i$ register will contain the concrete slot number that is represented by this abstraction pair during system runs. In addition, the container register $cont_i$ and its next state register $cont'_i$ are introduced for the represented slot. The container register is initialized in a way that corresponds to the initialization of the original mem node. The function driving the next state register cont' is taken as the node in the updated netlist for the next state function of the identified memory. This is possible because the definition of a remodellable memory in this example guarantees that the next state function for mem is a pure memory node for mem.

Next, the pure memory nodes in the netlist for the identified remodellable memory mem are replaced by substitute nodes. As indicated at block 705, if the node is the identified memory, then the container register ($cont^i$) and initialization vector corresponding to the current abstraction pair are used as substitute nodes for the memory (block 706). If the node is a write node of the form write($op^k$, $addr^j$, $data^m$) (block 707), it is replaced by the logic mux($sel^i$=$addr^j$, $data^m$, s0), where s0 represents the node corresponding to $op^k$ in the updated netlist, such as the container register cont in FIG. 5 (block 708).

Figure 8:
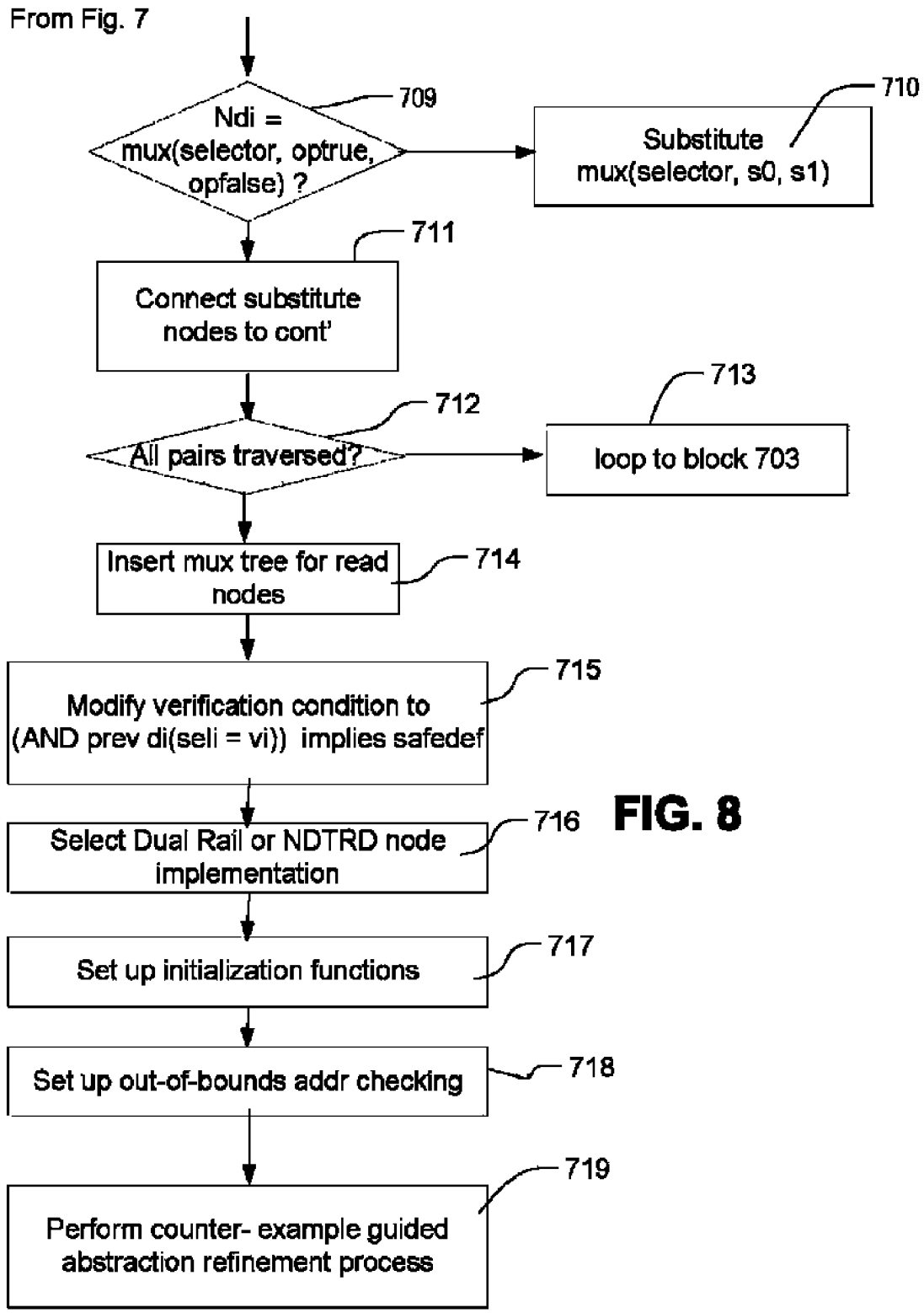

Proceeding to FIG. 8, if the node is a multiplexer of the form mux(selector, optrue, opfalse) (block 709), it is replaced by the logic mux($sel^i$=$addr^j$, s0, s1), where s0 and s1 are the nodes representing optrue and opfalse respectively in the updated netlist (block 710).

Next, the substitute node is connected to the next state container register $cont'^i$ for the corresponding slot, such as node 504 is connected to cont' 503 in FIG. 5 (block 711). The process traverses the abstraction pairs in this manner until they are all re-implemented in the updated netlist (block 712, block 713).

Next, read nodes are re-implemented. If the node has the form read($op^k$, $addr^j$), where $op^k$ is replaced by a represented slot in the memory for an abstraction pair, then the read node multiplexer tree is modified to include this represented slot (block 714). The implementation of the multiplexer tree for read nodes is described below with reference to FIG. 10.

After processing the nodes corresponding to the identified memory, the verification condition is modified (block 715) so that the property is only checked when the signals $v_i$ identified by the abstraction nodes have had the selected values at the appropriate previous time instances $d_i$. One technique for implementing verification condition is to define a temporal formula $prev^{di}(s)$, that is true at time t in the execution of the system precisely if t≧d and a combinational signal s evaluates to true at time t−d. Assuming that there n abstraction pairs ($v_i$, $d_i$) for the signal s, the new safe output can be generated by synthesizing a checker for the temporal formula:

$$\left(\bigwedge_{i=0}^{n-1} prev^{di}(sel_i^l = v_i^l)\right) \to safedef$$

where safedef is taken to be the combinational node feeding the old safe output. In the example described in FIG. 4, safedef would be the node 406 which is true when the data on the read data port rd is not equal to 100. This checker can be implemented in a simple manner using a number of register chains that delay previous values of some netlist node comparisons. An example is described below with reference to FIG. 10. It is noted that the identified memory mem is a remodellable memory. Therefore it can only occur in the fanin of other state variables through read nodes. The updated netlist re-implements all the read nodes necessary for satisfying the safety condition. Therefore, the netlist can be reduced by removing the original memory mem and all the logic that depends on it in the manner described above.

Blocks 716-718 illustrate additional steps involved in re-implementing the netlist for some embodiments of the process. These nodes are inserted in the flow chart to reflect that they are a part of examples of the process that can be used, rather than to indicate an order in which the processed are executed. First, as mentioned above, the register ndtrd is introduced for all read nodes in one approach. An alternative implementation can apply dual rail encoding, adding an extra bit to the registers in the signal path which operates as a flag to indicate whether the contents are non-determinate. The netlist can be evaluated to determine which approach is more efficient for a given circuit design implementation, and that technique chosen (block 716). This can be done by executing the re-implementation loop (e.g. nodes 702-715) once using dual rail encoding, and once using non-determinate data nodes, and comparing the results. Also, initialization functions can be set up for various nodes, including the container nodes for the memory that are not all zeros or all ones, relaxing the definition of the remodellable memory to allow non-uniform initialization (Block 717). Finally, definition of remodellable memory can be relaxed to allow unconstrained address widths, and in such cases the updated netlist can be further updated by adding out-of-bounds address checking for read and write nodes (block 718).

Once the updated netlist has been generated, then the process proceeds to perform a counter-example guided abstraction refinement process to determine whether additional abstraction pairs need to be added (block 719). Details of a representative counter-example guided extraction refinement process are described with reference to FIG. 11.

Figures 9, 10:
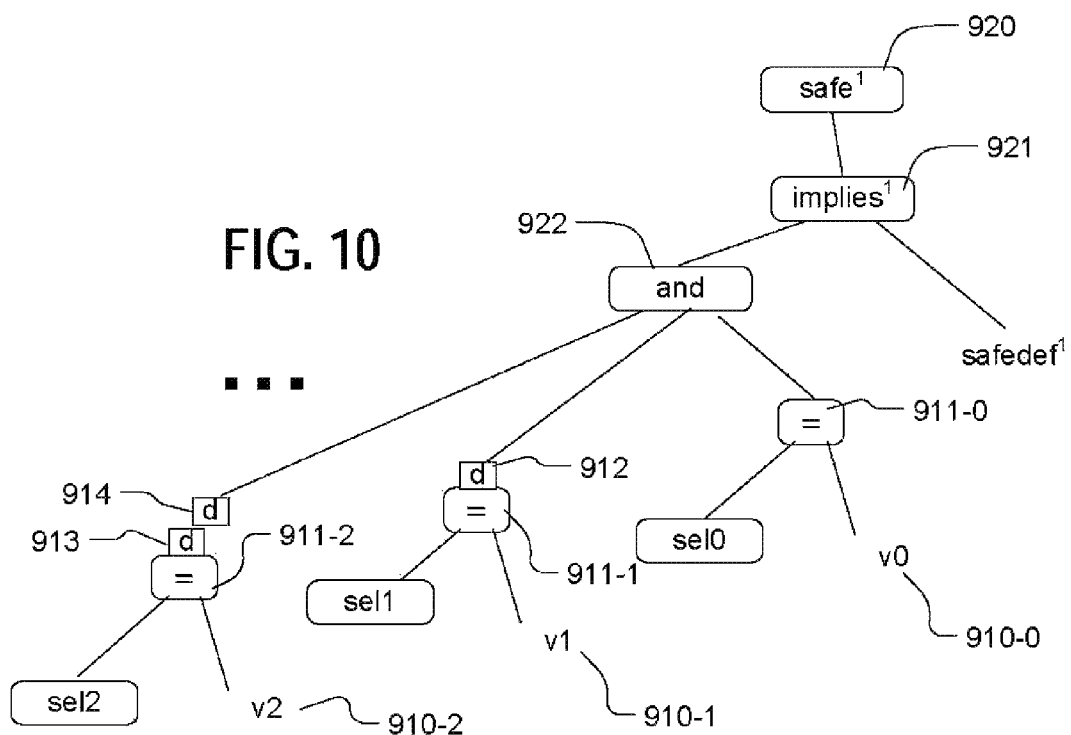
FIG. 9 illustrates an implementation of a multiplexer tree for read nodes.
FIG. 10 illustrates an implementation of a safety property for use with an updated netlist including a plurality of abstraction pairs.

As mentioned above with reference to block 714, pure read nodes are represented in the updated netlist by a multiplexer tree of the form shown in FIG. 9. The multiplexer tree shown in FIG. 9 returns the contents of the first selected slot with an address matching the address on the read address port ra. If the address does not match any selected slot, then a nondeterministic value is read from the environment at the input node ndtrd 901. The multiplexer tree includes multiplexers 905-0 to 905-$n$, and receives as input the nodes identifying represented slots sel0 to seln, which are compared with the address on the read address port at comparator nodes 902-0 to 902-$n$. The outputs of the comparator nodes 902-0 to 902-$n$, are used as selector inputs on corresponding multiplexers 905-0 to 905-$n$. Also, the multiplexer tree receives as input the substitute nodes for the represented slots cont0 to contn. Multiplexer 905-0 selects the contents of cont0 if the output of comparator node 902-0 is true, else selects the output of multiplexer 905-1 (not shown). The last multiplexer 905-$n$ in the tree selects the contents of contn if the output of comparator node 902-$n$ is true, else selects the value in ndtrd node 901.

FIG. 10 illustrates a re-implementation of a verification condition as mentioned above with reference to block 713. In this example, the "safe" output 920 is driven by the implication operator 921. The implication operator operates to only check the output of the safety definition safedef[1], when the output of the AND node 922 is true. The AND node 922 is driven by a set of comparators over the abstraction pairs having their outputs delayed by the appropriate delay times indicated in the abstraction pairs. Thus, the value $v_0$ from abstraction pair $(v_0,d_0)$ 910-0 is compared with the sel0 node which identifies the slot represented by the abstraction pair. Because the delay value $d_0$ is zero indicating that the abstraction pair corresponds to a slot read in the current cycle, the output of the comparator 911-0 is applied to the AND node 922 without delay. The value $v_1$ from abstraction pair $(v_1,d_1)$ 910-1 is compared with the sel1 node which identifies the slot represented by the abstraction pair. Because the delay value $d_1$ is one indicating that the abstraction pair corresponds to a slot read in a cycle preceding the current cycle by one, the output of the comparator 911-1 is applied to the AND node 922 with a one cycle delay through register 912. The value $v_2$ from abstraction pair $(v_2,d_2)$ 910-2 is compared with the sel2 node which identifies the slot represented by the abstraction pair. Because the delay value $d_2$ is two indicating that the abstraction pair corresponds to a slot read in a cycle preceding the current cycle by two, the output of the comparator 911-2 is applied to the AND node 922 with a two cycle delay through registers 913 and 914. In FIG. 10, the delay registers are simplified to avoid crowding the drawing. In a representative system, the delay 912 is implemented by establishing a node d1 having a next state node d1'. The output of comparator 911-1 supplies node d1' in the current cycle. The contents of register d1 are supplied as input to the AND node 922. Likewise, the delays 913 and 914 are implemented by creating registers d1 and d2, where the next state register d1' is driven by the output of comparator 911-2, the current state register d1 drives the next state register d2', and d2 is supplied as input to the AND node 922.

Figure 11:
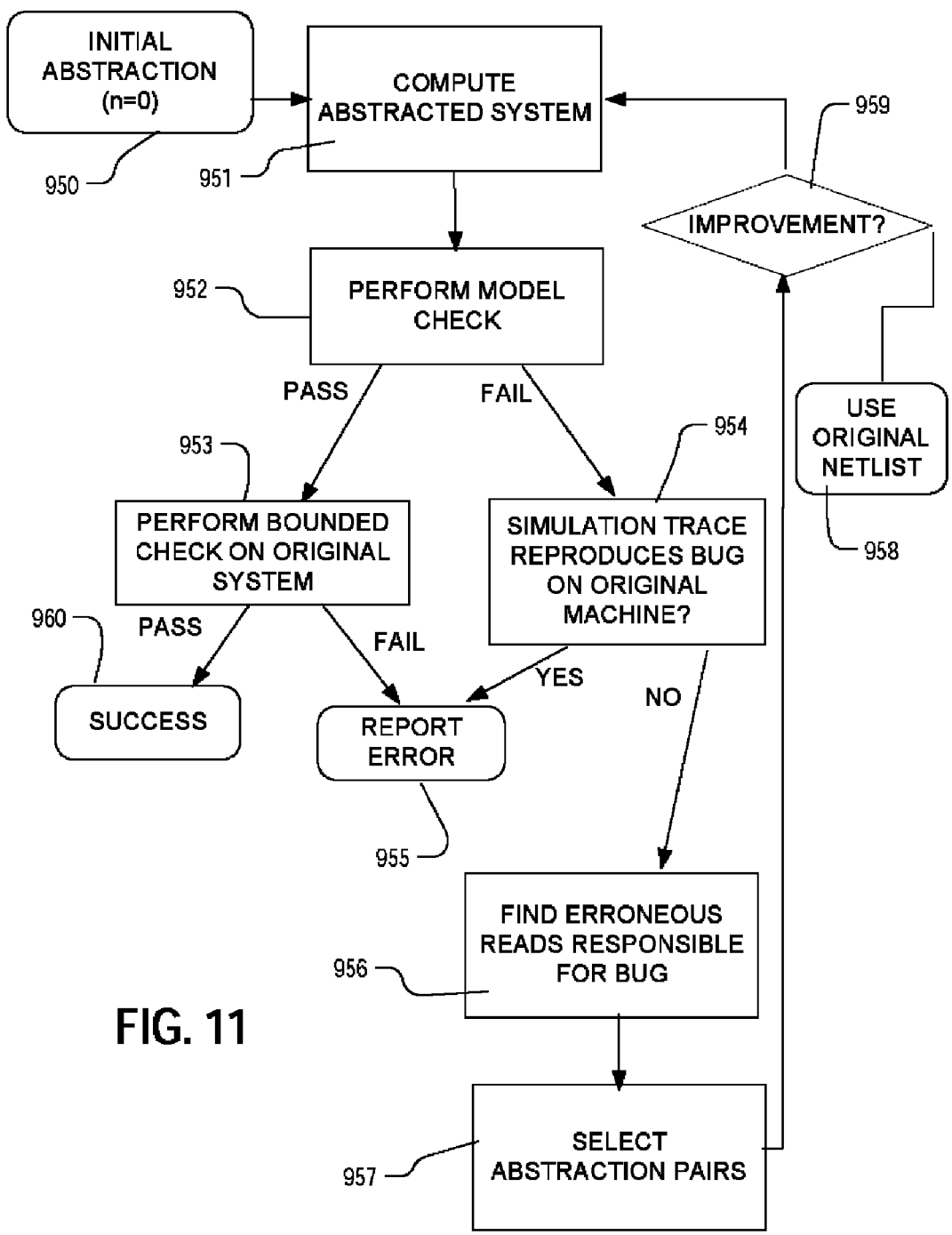
FIG. 11 is a block diagram of a computer implemented, counter-example guided, abstraction refinement loop.

FIG. 11 illustrates a process for finding abstraction pairs for a particular design problem. One alternative approach would be to rely on the user to provide an identification of a set of abstraction pairs as an input to the process. However, an automatic approach as shown in FIG. 11 is preferred. Thus, for the process of FIG. 11, we maintain a current set of abstraction pairs for each remodellable memory in the design. The set of abstraction pairs for each remodellable memory is monotonically growing in the iterative process shown in FIG. 11. The process provides an initial abstraction in which no memory slots of remodellable memories are represented, having zero abstraction pairs (block 950). In this initial abstraction, a system is represented where each read from a memory returns a nondeterministic result. Given the initial abstraction, an abstracted system is computed providing an updated netlist using the procedures described above with respect to FIGS. 7 and 8 for example (block 951). The updated netlist is applied to a bit level model checking routine, such as typically utilized in the art to check correctness of the design (block 952). If the property being checked holds on the updated netlist, the abstraction process proceeds to a bounded check on the original system (block 953). In this step, the bounded correctness of the original system is checked, bounded by the number of cycles corresponding to the largest delay value in the set of abstraction pairs in the updated netlist, using a standard SAT-based bounded model checking program. The system is declared correct if this check passes (block 960). If the bounded check of the original system fails, the original system is faulty and an error is reported (block 955).

If the model check at block 952 detects a counter-example on the abstracted system represented by the updated netlist, then the procedure attempts to refine the abstraction. The inputs of the abstracted system are a superset of the inputs of the original system. So the counter-example can be replayed by a simulation on the original system using the inputs and state variables determined from the trace indicating failure in the updated netlist (block 954). If the bug is detected in the simulation, then an error is reported to the user (block 955). If the bug does not occur in the simulation, it is necessary to refine the abstraction set to remove the error trace.

Because the only difference between the original and abstracted system that could introduce a spurious counter-example is the memory encoding, some abstracted read node at some time instance must return the contents of an unrepresented slot. By inspecting the simulation run on the original system and comparing the values of the pre- and post-abstraction read nodes, erroneous reads over time can be identified in the execution of the abstracted system (block 956).

Not all of the erroneous reads will have an impact on the checked property. The procedure determines a minimal set of reads and associated time points by initially forcing correct values for all erroneous reads in the abstract system simulation, and iteratively shrinking this corrected set in a greedy way until a local minimum of forced reads that still removes the error in simulation is determined.

Given a set of erroneous reads to be corrected, and the time distances from the error cycle in which the erroneous reads occurred, an abstraction signal must be identified for each time point. The abstraction signals can be chosen using a heuristic, such as the following: if the fraction of read nodes for a memory relative to the number of memory slots is smaller than some empirically selected value, such as 20%, then the address signals of the failing read at their corresponding time distance from the final cycle, are used to create new abstraction pairs. However, if the fraction of read nodes for a memory relative to the number of memory slots is greater than the selected value, then the procedure searches for a register that (1) is of the same size as the address width of the memory, (2) is in the cone-of-influence of the memory, and (3) contains the address value being read by the erroneous read node at the time instances that the read is performed.

Upon finding a register meeting these criteria, the identified register node is used to create a new abstraction pair. In circuit designs having a large number of read nodes, in order to successfully abstract the memory, a register entry that contains the identified slot should occur somewhere else in the design. This assumption is crucial for dealing with certain types of memories, such as content addressable memory where every entry in the memory is read in each cycle, but only a small number of reads at a given time matter.

For example, assume a counter-example 15 cycles in length for an abstracted version of the design with a single remodellable memory with 32 slots and two read nodes. If a read node of the form read (mem, $raddr_i$) needs to have a correct value at cycle 13, which is one time step before the failure cycle, in order to remove the bug trace, an abstraction pair ($raddr_i$, 1) is added to the current abstraction set. However if the memory had 28 read nodes, then the procedure would search for a register reg, that at cycle 13 contained the concrete address for which the read failed, and the found register would form the basis of a new abstraction set (reg, 1). If no such register exists, then the procedure reverts to the original un-abstracted modeling of the memory.

After the new set of abstraction pairs has been selected at block 957, the process performs the step of evaluating whether progress is being made (block 959). Of course this step, along with other steps in the process illustrated in FIG. 11 can occur in any appropriate order. For example, if the abstracted size determined after block 951 for example, is greater than 75% of the size of the original netlist, then the procedure can branch to use the original netlist (block 958). In an alternative, at block 959 the system may check to determine whether the processing has exceeded a time limit, or exceeded a pre-specified number of loops to indicate whether improvement is being achieved.

In any event, the new set of abstraction pairs is added to the abstracted system and such modifications needed to accommodate the new set of abstraction pairs are completed (block 951). The procedure iterates around the loop shown in FIG. 11 until the model checking succeeds (block 960), an error is reported (block 955), or decision is made to use the original netlist (block 958).

A technology is introduced that uses word-level netlist information to identify remodellable memories. Such memories interact with their environment using dedicated read and write nodes only, are initialized in a specified way, and are accessed uniformly. An abstraction for netlists containing such memories is applied that allows proofs for certain types of properties for which the proof can be done by reasoning about a significantly smaller number of memory slots and time instances than what would be needed in a standard bit-level model check. In order to avoid having to rely on abstraction information from the users, a counter-example driven abstraction refinement framework can be used that analyzes spurious counter examples to incrementally refine the abstraction.

Features of the technology include that (1) it fits into a standard transformation-based verification system for safety property verification, (2) the algorithms are completely automatic, (3) no input is required on abstraction from users, and (4) any bit-level model checker can be used as the decision procedure in our abstraction refinement framework.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for processing a computer implemented representation of a circuit design, comprising:
   representing the circuit design, as a data structure defining a netlist as a plurality of nodes;
   identifying nodes representing a memory in the data structure, and processing the netlist using a data processor to produce an updated netlist, including
      identifying a slot or slots in the memory for representation in the updated netlist;
      substituting the nodes in the netlist representing the memory with substitute nodes implementing the identified slot or slots; and
      implementing a verification condition for the circuit design that enables checking of a pre-specified property of the circuit design using the substitute nodes.

2. The method of claim 1, wherein the netlist comprises nodes arranged in a directed acyclic graph, including word-level nodes representing logical and arithmetic operators, word-level nodes representing multiplexer operators, word-level nodes representing concatenation operators, word-level nodes representing extraction operators, word-level nodes representing reads, word-level nodes representing writes, word-level nodes representing state variables and word-level nodes representing binary constants.

3. The method of claim 1, wherein said identifying nodes representing a memory include determining for the memory and for the next state function for the memory that all read and write nodes addressing the memory, read and write data of the same width and use address nodes of the same width.

4. The method of claim 1, wherein the pre-specified property is a safety definition.

5. The method of claim 1, wherein the updated data structure comprises a netlist.

6. The method of claim 1, including manufacturing an integrated circuit using said circuit design.

7. A method for processing a computer implemented representation of a circuit design, comprising:
   representing the circuit design as a data structure defining a netlist as a plurality of nodes;
   identifying nodes representing a memory in the data structure, and processing the netlist using a data processor to produce an updated netlist, including
      identifying a slot or slots in the memory for representation in the updated netlist;
      substituting the nodes in the netlist re representing the memory with substitute nodes implementing the identified slot or slots; and
      implementing a verification condition for the circuit design that enables checking of a pre-specified property of the circuit design using the substitute nodes;
   wherein said substituting replaces the memory with a set of substitute nodes, including
      for each represented slot, current state and next state substitute nodes and current state and next state nodes identifying the represented slot, and
      for nodes representing writes to a corresponding slot implementing a multiplexer updating the contents of a next state substitute node for the slot with write data if the write address matches an output of the current state node identifying the represented slot, or else updating the contents of a next state substitute node for the slot with contents of a current state substitute node for the slot, and for nodes in the netlist representing reads to a corresponding slot implementing a multiplexer returning contents of the current state substitute node for the slot if the read address matches an output of the current state node identifying the represented slot, or else returning non-determinate data.

8. A method for processing a computer implemented representation of a circuit design, comprising:
representing the circuit design as a data structure defining a netlist as a plurality of nodes;
identifying nodes representing a memory in the data structure, and processing the netlist using a data processor to produce an updated netlist, including
identifying a slot or slots in the memory for representation in the updated netlist;
substituting the nodes in the netlist re representing the memory with substitute nodes implementing the identified slot or slots; and
implementing a verification condition for the circuit design that enables checking of a pre-specified property of the circuit design using the substitute nodes including implementing said verification condition by identifying abstraction pairs, said abstraction pairs including an abstracted node in the updated netlist corresponding to a current state substitute node in the updated netlist and a delay parameter indicating a cycle in which to read the current state substitute node using an output of the abstracted node, and establishing a set of nodes in the updated netlist that compares the abstracted node with the node identifying the represented slot for the corresponding current state substitute node in the indicated cycle, and if a match is indicated for the identified abstraction pairs, then checking a pre-specified property.

9. The method of claim 8, including performing a counterexample guided refinement process to identify the abstraction pairs.

10. The method of claim 8, including providing an initial updated netlist;
performing a model checking process over the initial updated netlist, and if the model checking fails in a particular state, then running a simulation using the input netlist based on a set of inputs and initial state variable assignments determined from the particular state; if the simulation passes, then finding erroneous reads responsible for the failure detected in the updated netlist, selecting abstraction pairs to address the erroneous reads and adding the selected abstraction pairs to the updated netlist.

11. A data processing system adapted to process a computer implemented representation of a circuit design, comprising:
a data processor and memory coupled to the data processor, the memory storing instructions executable by the data processor representing the circuit design in the memory as a data structure defining a netlist as a plurality of nodes; including instructions
to identify nodes representing a memory in the data structure, and to process the netlist to produce an updated netlist, including
identifying a slot or slots in the memory for representation in the updated netlist;
substituting the nodes in the netlist representing the memory with substitute nodes implementing the identified slot or slots; and
implementing a verification condition for the circuit design that enables checking of a specified safety definition using the substitute nodes.

12. The data processing system of claim 11, wherein the netlist comprises nodes arranged in a directed acyclic graph, including word-level nodes representing logical and arithmetic operators, word-level nodes representing multiplexer operators, word-level nodes representing concatenation operators, word-level nodes representing extraction operators, word-level nodes representing reads, word-level nodes representing writes, word-level nodes representing state variables and word-level nodes representing binary constants.

13. The data processing system of claim 11, wherein said instruction to identify nodes representing a memory includes instructions to determine for the memory and for the next state function for the memory that all read and write nodes address the memory, read and write data of the same width and use address nodes of the same width.

14. The data processing system of claim 11, wherein the pre-specified property is a safety definition.

15. The data processing system of claim 11, wherein the updated data structure comprises a netlist.

16. A data processing system adapted to process a computer implemented representation of a circuit design, comprising;
a data processor and memory coupled to the data processor, the memory storing instructions executable by the data processor representing the circuit design in the memory as a data structure defining a netlist as a plurality of nodes; including instructions
to identify nodes representing a memory in the data structure and to process the netlist to produce an updated netlist, including
identifying a slot or slots in the memory for representation in the updated netlist;
substituting the nodes in the netlist re resenting the memory with substitute nodes implementing the identified slot or slots; and
implementing a verification condition for the circuit design that enables checking of a specified safety definition using the substitute nodes;
wherein said substituting replaces the memory with a set of substitute nodes for each represented slot, said set including current state and next state substitute nodes and current state and next state nodes identifying the represented slot, and for nodes representing writes to a corresponding slot implementing a multiplexer updating the contents of a next state substitute node for the slot with write data if the write address matches an output of the current state node identifying the represented slot, or else updating the contents of a next state substitute node for the slot with contents of a current state substitute node for the slot, and for nodes in the netlist representing reads to a corresponding slot implementing a multiplexer returning contents of the current state substitute node for the slot if the read address matches an output of the current state node identifying the represented slot, or else returning non-determinate data.

17. A data processing system adapted to process a computer implemented representation of a circuit design, comprising;
a data processor and memory coupled to the data processor, the memory storing instructions executable by the data processor representing the circuit design in the memory as a data structure defining a netlist as a plurality of nodes; including instructions
to identify nodes representing a memory in the data structure and to process the netlist to produce an updated netlist, including identifying a slot or slots in the memory for representation in the updated netlist;

substituting the nodes in the netlist re representing the memory with substitute nodes implementing the identified slot or slots; and implementing a verification condition for the circuit design that enables checking of a specified safety definition using the substitute nodes;

said instructions implementing said verification condition by identifying abstraction pairs, said abstraction pairs including an abstracted node in the updated netlist corresponding to a current state substitute node in the updated netlist and a delay parameter indicating a cycle in which to read the current state substitute node using an output of the abstracted node, and establishing a set of nodes in the updated netlist that compares the abstracted node with the node identifying the represented slot for the corresponding current state substitute node in the indicated cycle, and if a match is indicated for the identified abstraction pairs, then checking a pre-specified property.

18. The data processing system of claim 17, including instructions for performing a counter-example guided refinement process to identify the abstraction pairs.

19. The data processing system of claim 17, including instructions
providing an initial updated netlist; and
performing a model checking process over the initial updated netlist, and if the model checking fails in a particular state, then running a simulation using the input netlist based on a set of inputs and initial state variable assignments determined from the particular state; if the simulation passes, then finding erroneous reads responsible for the failure detected in the updated netlist, selecting abstraction pairs to address the erroneous reads and adding the selected abstraction pairs to the updated netlist.

20. An article of manufacture providing software adapted to process a computer implemented representation of a circuit design, comprising:

a memory readable by a data processor, the memory storing instructions executable by the data processor representing the circuit design in the memory as a data structure defining a netlist as a plurality of nodes; and including instructions to identify nodes representing a memory in the data structure, and to process the netlist produce an updated netlist, including identifying a slot or slots in the memory for representation in the updated netlist;

substituting the nodes in the netlist representing the memory with substitute nodes implementing the identified slot or slots; and implementing a verification condition for the circuit design that enables checking of a pre-specified property of the circuit design using the substitute nodes.

* * * * *

UNITED STATES PATENT AND TRADEMARK OFFICE
CERTIFICATE OF CORRECTION

| | | |
|---|---|---|
| PATENT NO. | : 8,001,498 B2 | Page 1 of 1 |
| APPLICATION NO. | : 12/258724 | |
| DATED | : August 16, 2011 | |
| INVENTOR(S) | : Per M. Bjesse | |

It is certified that error appears in the above-identified patent and that said Letters Patent is hereby corrected as shown below:

In the Claims

In claim 7 in column 16, line 49, delete the word "re".

In claim 8 in column 17, line 16, delete the word "re".

In claim 16 in column 18, line 34, replace the words "re resenting" with -- representing --.

In claim 17 in column 19, line 3, delete the word "re".

Signed and Sealed this
First Day of July, 2014

Michelle K. Lee
*Deputy Director of the United States Patent and Trademark Office*